US009852891B2

(12) United States Patent
Popovic et al.

(10) Patent No.: US 9,852,891 B2
(45) Date of Patent: Dec. 26, 2017

(54) RADIO FREQUENCY PLASMA METHOD FOR UNIFORM SURFACE PROCESSING OF RF CAVITIES AND OTHER THREE-DIMENSIONAL STRUCTURES

(71) Applicants: Svetozar Popovic, Norfolk, VA (US); Janardan Upadhyay, Norfolk, VA (US); Leposava Vuskovic, Norfolk, VA (US); H. Lawrence Phillips, Hayes, VA (US); Anne-Marie Valente-Feliciano, Newport News, VA (US)

(72) Inventors: Svetozar Popovic, Norfolk, VA (US); Janardan Upadhyay, Norfolk, VA (US); Leposava Vuskovic, Norfolk, VA (US); H. Lawrence Phillips, Hayes, VA (US); Anne-Marie Valente-Feliciano, Newport News, VA (US)

(73) Assignee: Old Dominion University Research Foundation, Norfolk, VA (US)

( * ) Notice: Subject to any disclaimer, the term of this patent is extended or adjusted under 35 U.S.C. 154(b) by 286 days.

(21) Appl. No.: 14/688,363

(22) Filed: Apr. 16, 2015

(65) Prior Publication Data

US 2017/0040144 A1 Feb. 9, 2017

(51) Int. Cl.
*B44C 1/22* (2006.01)
*C03C 15/00* (2006.01)
*C03C 25/68* (2006.01)
*C23F 1/00* (2006.01)
*H01J 37/32* (2006.01)

(52) U.S. Cl.
CPC .. *H01J 37/32192* (2013.01); *H01J 37/32082* (2013.01); *H01J 37/32394* (2013.01); *H01J 37/32403* (2013.01); *H01J 37/32449* (2013.01); *H01J 37/32467* (2013.01); *H01J 37/32541* (2013.01); *H01J 37/32568* (2013.01); *H01J 37/32596* (2013.01); *H01J 37/32816* (2013.01); *H01J 2237/334* (2013.01)

(58) Field of Classification Search
USPC .......................................................... 216/71
See application file for complete search history.

(56) References Cited

U.S. PATENT DOCUMENTS

2007/0107749 A1* 5/2007 Sin ...................... C23C 16/4405
134/1.1

* cited by examiner

*Primary Examiner* — Roberts Culbert
(74) *Attorney, Agent, or Firm* — Nixon Peabody LLP; Eduardo J. Quinones

(57) ABSTRACT

A method for efficient plasma etching of surfaces inside three-dimensional structures can include positioning an inner electrode within the chamber cavity; evacuating the chamber cavity; adding a first inert gas to the chamber cavity; regulating the pressure in the chamber; generating a plasma sheath along the inner wall of the chamber cavity; adjusting a positive D.C. bias on the inner electrode to establish an effective plasma sheath voltage; adding a first electronegative gas to the chamber cavity; optionally readjusting the positive D.C. bias on the inner electrode reestablish the effective plasma sheath voltage at the chamber cavity; etching the inner wall of the chamber cavity; and polishing the inner wall to a desired surface roughness.

23 Claims, 25 Drawing Sheets

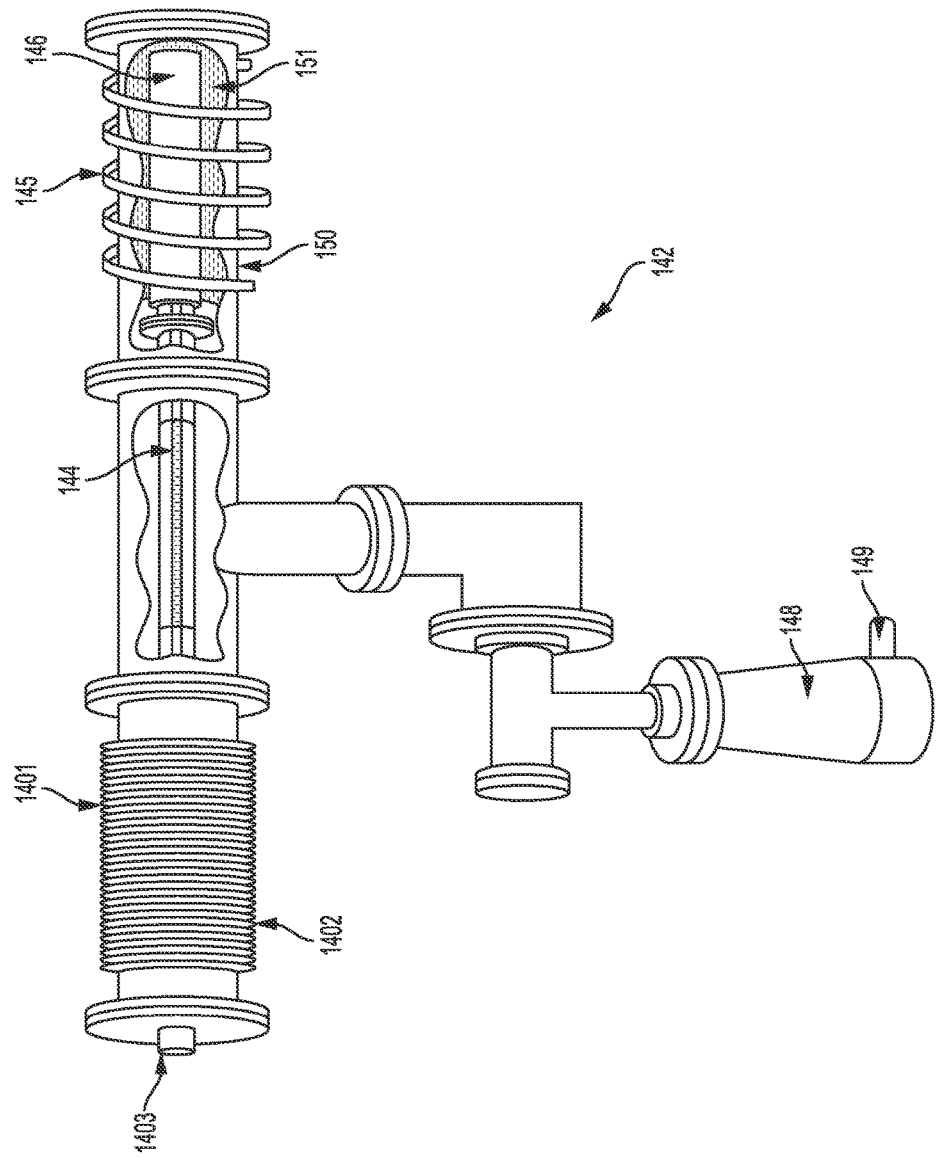

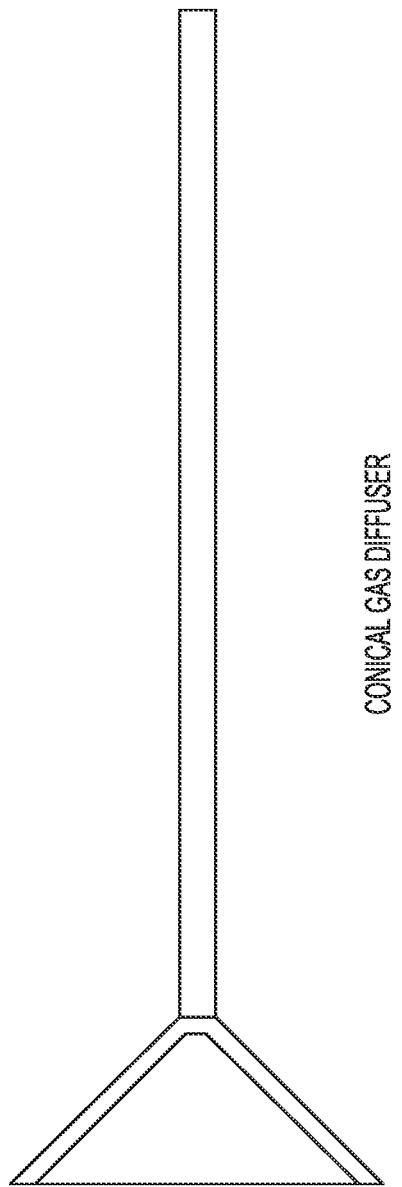

MOVING GAS DIFFUSER

RADIO FREQUENCY PLASMA METHOD FOR UNIFORM SURFACE PROCESSING OF RF CAVITIES AND OTHER THREE-DIMENSIONAL STRUCTURES

STATEMENT REGARDING FEDERALLY SPONSORED RESEARCH OR DEVELOPMENT

The present invention was made in the course of federally sponsored research or development pursuant to U.S. Department of Energy Project RF #325111. The United States Government may have certain Walk-In-Rights in the invention.

CROSS REFERENCE TO RELATED APPLICATION

This application claims priority to U.S. Provisional Application Ser. No. 61/982,017, filed on Apr. 21, 2014, the entirety of which is incorporated herein by reference.

TECHNICAL FIELD

The invention relates generally to a method for plasma etching of surfaces and more specifically to a method for efficient plasma etching of surfaces inside three-dimensional structures.

BACKGROUND

Generally, in reactive ion etching processes, an electric field plays a fundamental role. The chemistry in many discharges is affected strongly by the ion flux and energy distribution in the sheath and at the surface of walls and electrodes, which are in turn determined by the sheath electric field. Using measurements of electric fields in plasmas to provide a direct insight into the physics of discharges can be experimentally demanding. Moreover, the control of the electric field based on measurements is almost impossible to establish by feedback mechanisms. Therefore, the electric field in the sheath has to be controlled by external parameters, such as radiofrequency power and frequency combined with d.c. bias, radiofrequency circuit parameters, electrode dimensions and shape, pressure and composition of gas mixture. In order to control the electric field in the sheath with an external parameter, a link between one or more external parameters and a particular component of the electric field must be established.

Corrugated electrodes have been used in a number of applications in a variety of research areas, including such disparate fields as the development of biomedical and environmental chemistry devices or the development of capacitors, but were rarely applied to asymmetric discharges. In those rare cases where corrugated electrodes were applied to asymmetric discharges, the corrugated electrodes were applied in planar geometry with the aim to increase the average sheath thickness, reduce the electron and ion flux to the surface, and decrease the density of power dissipated into the electrode material. The driven electrode expansion concept is aimed to reduce the asymmetry of the dissipated power and the asymmetry in sheath voltage which is illustrated by the sheath voltage ratio relationship with the surface area ratio, as expressed in Equation (1) of power dissipated into the electrode material. The driven electrode expansion concept is aimed to reduce the asymmetry of the dissipated power and the asymmetry in sheath voltage which is illustrated by the sheath voltage ratio relationship with the surface area ratio, as expressed in Equation (1)

$$\frac{V_1}{V_2} = \left(\frac{A_2}{A_1}\right)^n \tag{1}$$

where V is the sheath voltage, A is the electrode surface area, n is between 1.3 and 3 in the present set-up, and the indices "1" and "2" refer to the driven and the processed electrode, respectively.

The driven electrode surface expansion concept has never been applied to an asymmetric discharge with a cylindrical coaxial geometry. A need, therefore, exists for a system and a method to apply the driven electrode surface expansion concept to an asymmetric discharge with a cylindrical geometry.

Additionally, it is known that in wet etching processes the etching rate increases with the temperature. However, increasing the etching rate by increasing the temperature has never been attempted in dry plasma processes. A need, therefore, exists for a system and a method for increasing the etching rate by increasing the temperature of a dry plasma process.

SUMMARY

According to various embodiments, the method can include positioning an inner electrode within the chamber cavity; evacuating the chamber cavity; adding a first inert gas to the chamber cavity; regulating the pressure in the chamber; generating a plasma sheath along the inner wall of the chamber cavity; adjusting a positive D.C. bias on the inner electrode to establish an effective plasma sheath voltage; adding a first electronegative gas to the chamber cavity; optionally readjusting the positive D.C. bias on the inner electrode reestablish the effective plasma sheath voltage at the chamber cavity; etching the inner wall of the chamber cavity; and polishing the inner wall to a desired surface roughness.

Application of plasma etching to Nb cavities, according to various embodiments, can have at least two major benefits in the cost reduction of the next generation particle accelerators. The first involves the potential increase in consistency in performance in the quality factor Q, which is defined as a stored energy divided by the dissipated energy within one RF cycle and gradient achieved from cavity to cavity. This is possible since the final stage of plasma etching produces a pure niobium surface free from suboxides and residue from wet chemistry. A variety of superior high quality surfaces can be intentionally created through plasma processing, such as pure niobium pentoxide without suboxides, or superconducting niobium nitride, which has excellent stability as a diffusion barrier and a low secondary electron yield. Such surface modifications can be done in the same process cycle with the plasma etching process. The second cost benefit of plasma etching arises from its nearly insignificant process cost compared to wet chemistry, not only in terms of basic process costs but also in terms of impact on the environment and personnel safety. The proposed work will demonstrate that plasma etching provides (a) high etching rates; (b) low surface roughness; (c) better control of the final SRF surface; (d) improved RF performance at substantially lower operational costs; and (e) reduced environmental hazard due to the use of hydrofluoric acid in the chemical bath.

Gas plasma etching method according to various embodiments can result in the improved surface features and lower surface roughness resulting in superior RF performance and higher-gradient SRF cavities, simplified, cleaner, and less expensive manufacturing process (compared to conventional wet chemical etching processes).

The use of reactive gases containing chlorine (Cl) atoms was a natural choice for the plasma treatment of Nb, since Nb compounds with Cl have a high vapor pressure and low boiling temperature. All experiments on thin films were performed using low-frequency RF discharges at low or moderate pressures. Depending on experimental conditions, etching rates varied from a few nm/min in the case of physical sputtering to a few hundred nm/min during reactive ion etching.

BRIEF DESCRIPTION OF THE DRAWINGS

These and other features, aspects, and advantages of the present invention will become better understood with reference to the following description and appended claims, and accompanying drawings where:

FIGS. 14*a* and 14*b*: are schematic illustrations of a heating method applied to an RF plasmasystem according to various embodiments;

FIG. 20*a*: is a schematic illustration showing gas diffuser;

Figure 1:
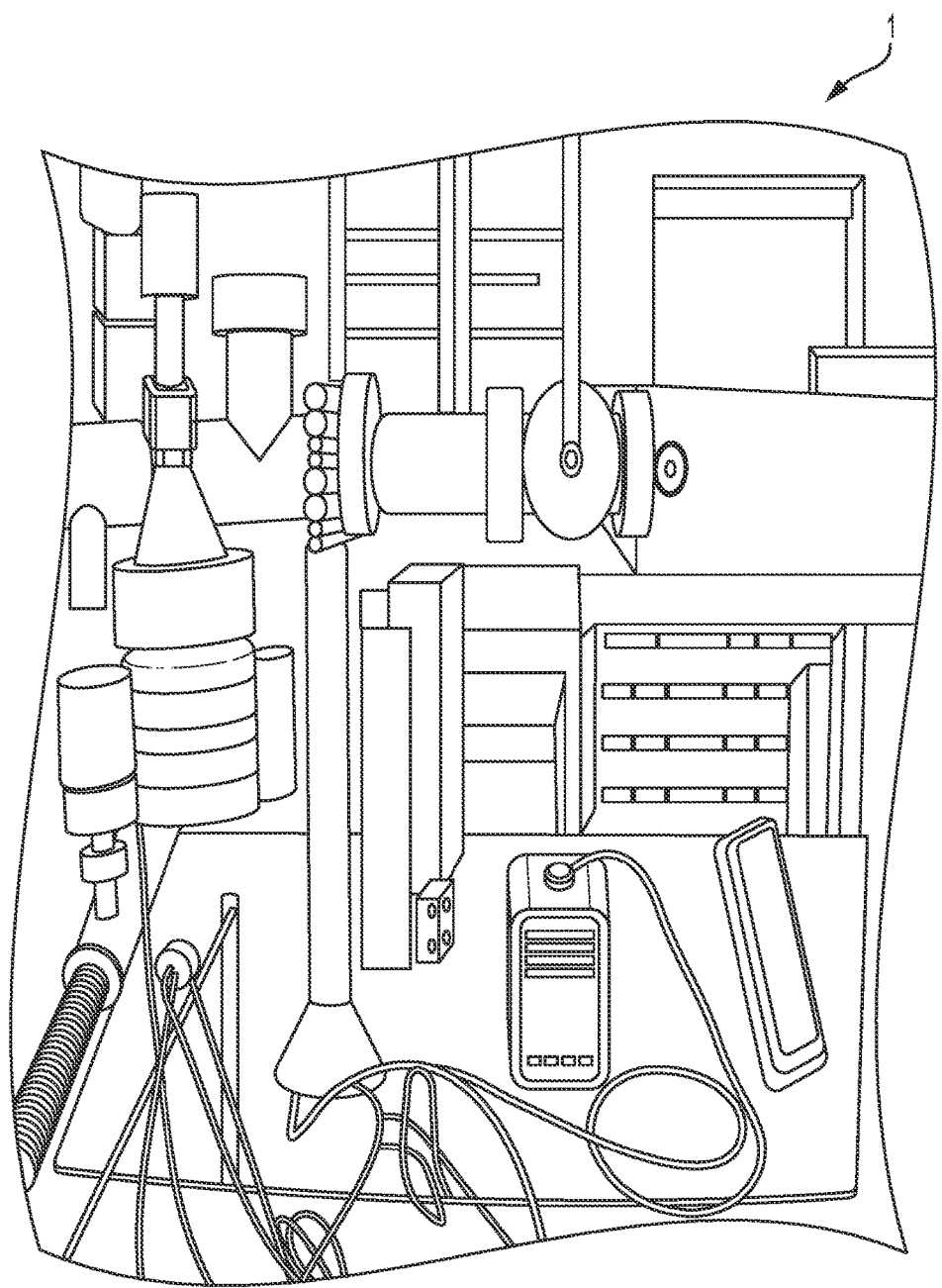
FIG. 1: is a photograph of an RF plasma etching system according to various embodiments.

It should be understood that the various embodiments are not limited to the arrangements and instrumentality shown in the drawings.

DETAILED DESCRIPTION OF THE INVENTION

The present invention may be understood more readily by reference to the following detailed description of preferred embodiments of the invention as well as to the examples included therein. All numeric values are herein assumed to be modified by the term "about," whether or not explicitly indicated. The term "about" generally refers to a range of numbers that one of skill in the art would consider equivalent to the recited value (i.e., having the same function or result). In many instances, the term "about" may include numbers that are rounded to the nearest significant figure.

Various embodiments of the invention describe methods and apparatus to etch, to purify, and to passivate a large-area Niobium (Nb) or other contaminated metallic surfaces using a cylindrical radiofrequency discharge in a gas mixture composed of specified amounts of argon (Ar), chlorine ($Cl_2$), helium (He), and oxygen ($O_2$). A radio frequency discharge can be generated between two coaxial full or segmented cylindrical electrodes in the capacitively-coupled regime, whereby the exposed inner surface of the outer electrode is being treated. U.S. Provisional Application Ser. No. 61/880,415, titled, "Efficient Plasma Etching of Surfaces Inside Three Dimensional Structures," filed Sep. 20, 2013, which is hereby incorporated by reference in its entirety, describes the use of a smooth central driven electrode in an asymmetric RF discharge with the processed surface acting as the grounded electrode, which can be treated at external room temperature.

Various embodiments of the present invention address the asymmetry of the discharge generated between two coaxial full or segmented electrodes in a capacitively-coupled regime, by using a corrugated, or otherwise area-enlarged driven electrode. Additionally or alternatively, various embodiments apply temperature variation on the sample surface, which can be the surface of the outer electrode. Additionally or alternatively, various embodiments introduce controlled motion of the driven (inner) electrode within the sample cavity to be etched. Hereinafter, the enlarged-area electrode will be referred to as the "corrugated electrode."

Through extensive experimentation with an externally heated grounded cylindrical electrode it has been determined that a substantial increase in etching rate can be achieved, under certain conditions, with increasing temperature. The temperature is an important point in ion-assisted etching. According to various embodiments, temperature enhances the chemical reactivity of the surface being etched. According to various embodiments it is desirable to etch an outer electrode. Therefore, the outer wall of an RF Plasma etching cylinder can be heated by various ways, such as with heating tape. FIG. 1 is a photograph of an RF plasma etching system 1 according to various embodiments. Heating tape is shown wrapped around the outer electrode cylinder of the RF plasma etching system 1. The outer cylinder forms the outer electrode of the system 1. An inner electrode can be positioned inside the outer cylinder. Heating the outer cylinder of the system 1 can improve the chemical reactivity of the inner surface of the outer cylinder, which is the surface to be etched according to various embodiments of the invention.

Various embodiments address the technology of processing superconducting radio frequency (SRF) cavities for particle accelerators. The cavities can be made of bulk niobium and the processing is aimed at producing a layer of pure superconducting material to avoid local heating due to impurities and oxide formation and subsequent loss of superconductivity. Plasma processing (plasma etching or plasma cleaning) of three-dimensional metal structures, such as cylindrical cavities, tubes or more complex components, as SRF cavities, would be substantially cheaper and more environmentally friendly compared to the commonly used wet (acid) processing. These cavities can be positioned as part of the RF Plasma etching system 1 to form the outer electrode. An inner electrode can be positioned within the cavity. The outer electrode can also be heated. The inner electrode can be a driven electrode and can be translated within the cavity.

Static plasma generation, as described in U.S. Provisional Application Ser. No. 61/880,415, would not be sufficient for uniform mass removal in plasma processing of a complex structure. Static plasma generation involves a fixed, unmovable driven electrode inside the structure to help produce plasma for processing. In this case, the loading effect, or the amount of the substrate exposed, reduces the processing rate, which would make uniform processing more difficult to perform. The solution is to apply the motion on the driven electrode, where it does not fully cover the longitudinal dimension of the structure, but activates the plasma and performs processing on a given segment only.

Figure 2:
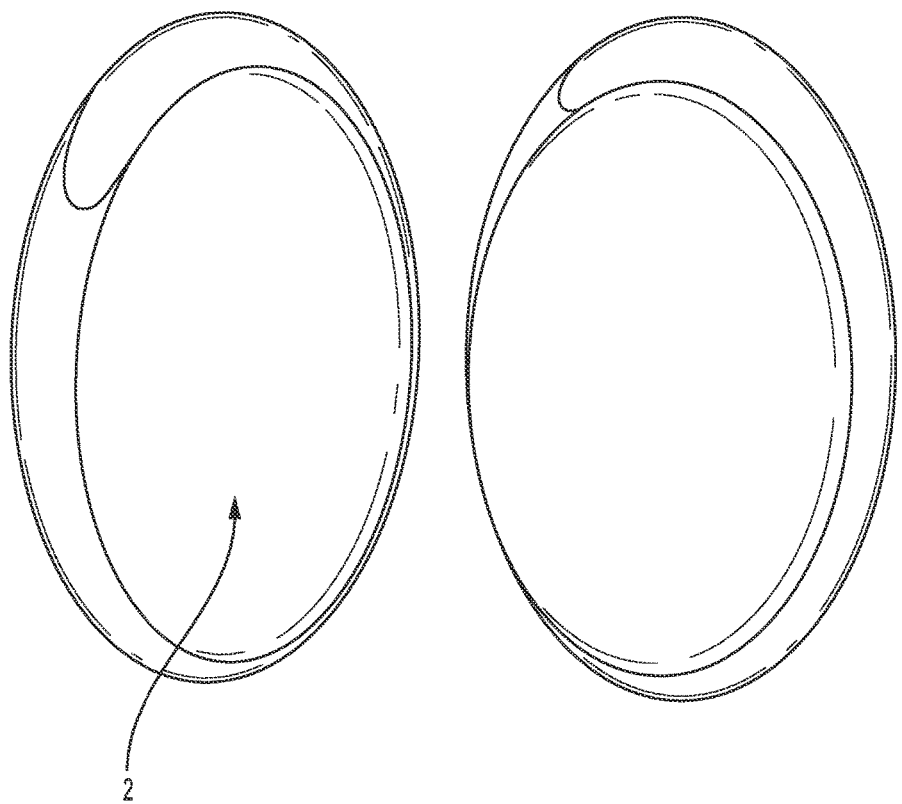
FIG. 2: is a photograph of ring samples with the diameter of the outer electrode.

According to various embodiments, a large-area cylindrical SRF cavity or part of it, with surface impurities and covered with Niobium Pentoxide (Nb2Os) can be positioned on the perimeter of a cylindrical chamber, acting as the outer electrode in an RF plasma etching system. This can be illustrated by the ring samples shown in FIG. 2, which shows ring samples with the diameter of the outer electrode. To verify the concept experimentally ring samples were used as substitutes for a part of outer treated surface. The ring samples were positioned over the inner surface of the cavity. Verification of the etching process is done by measuring mass difference of the rings before and after the procedure. These ring samples are just for experimental purpose in real application etch the whole inner surface of the cylinder is etched.

Figure 3:
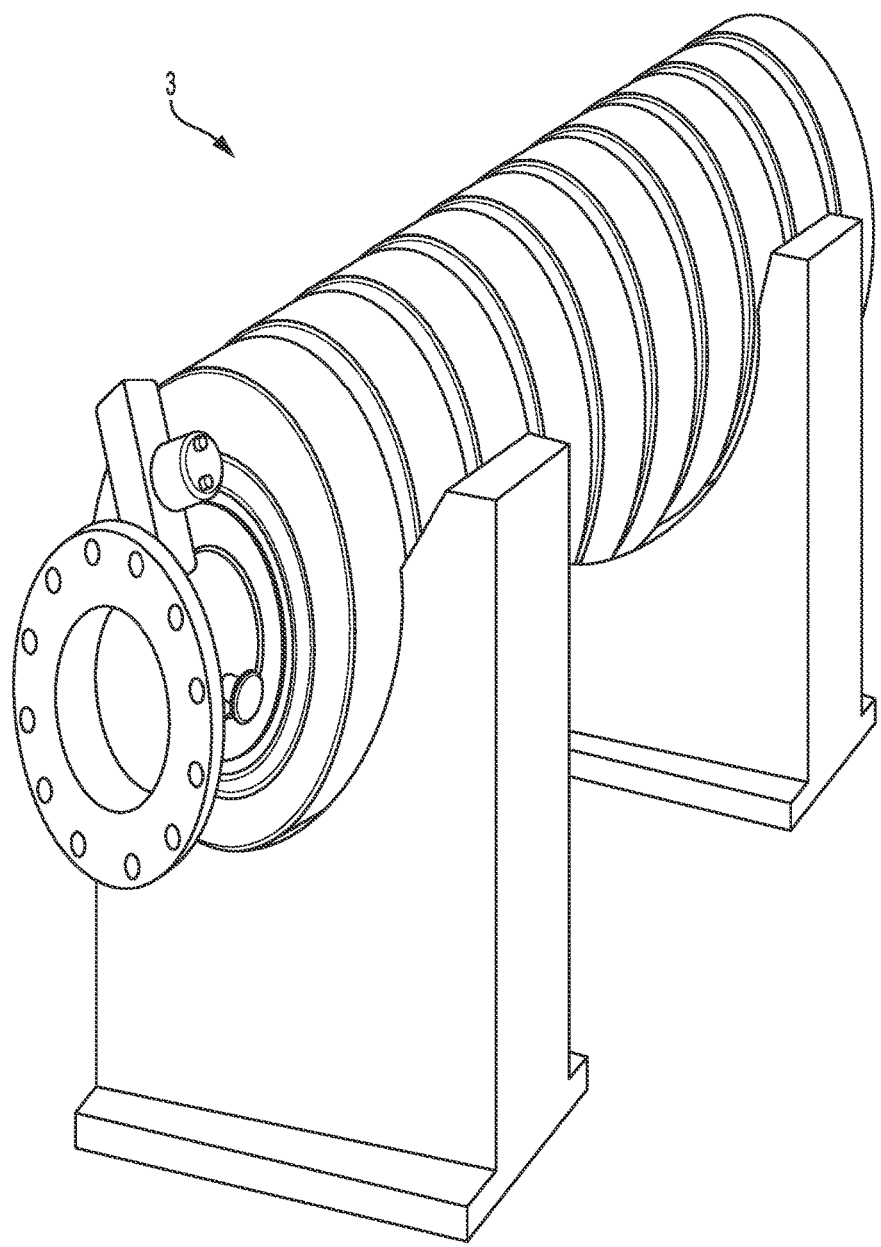
FIG. 3: is a photograph of a structure to be etched according to various embodiments.
Figure 4:
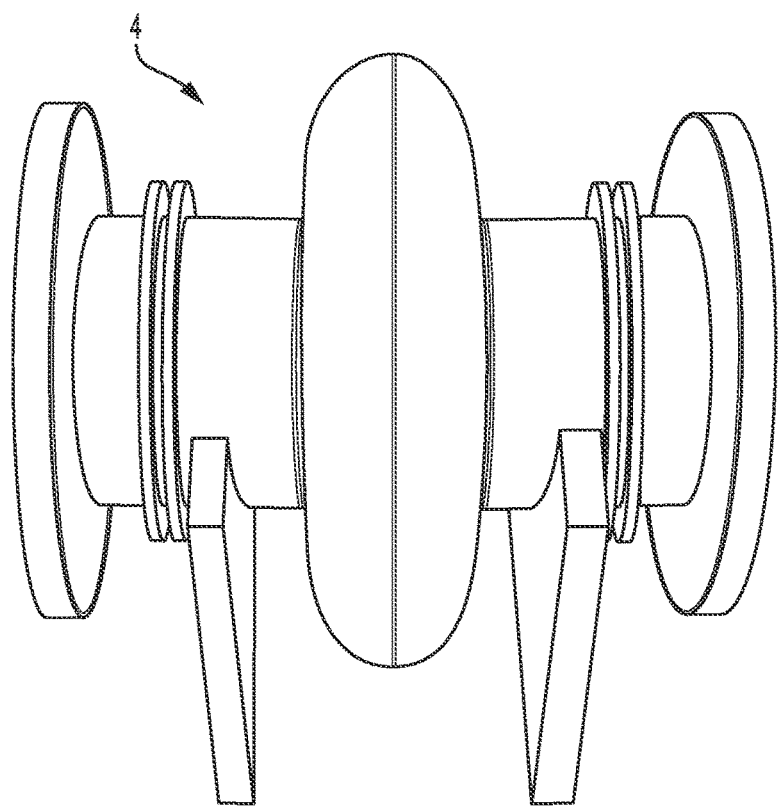
FIG. 4: is a photograph of a structure to be etched according to various embodiments.
Figure 5:
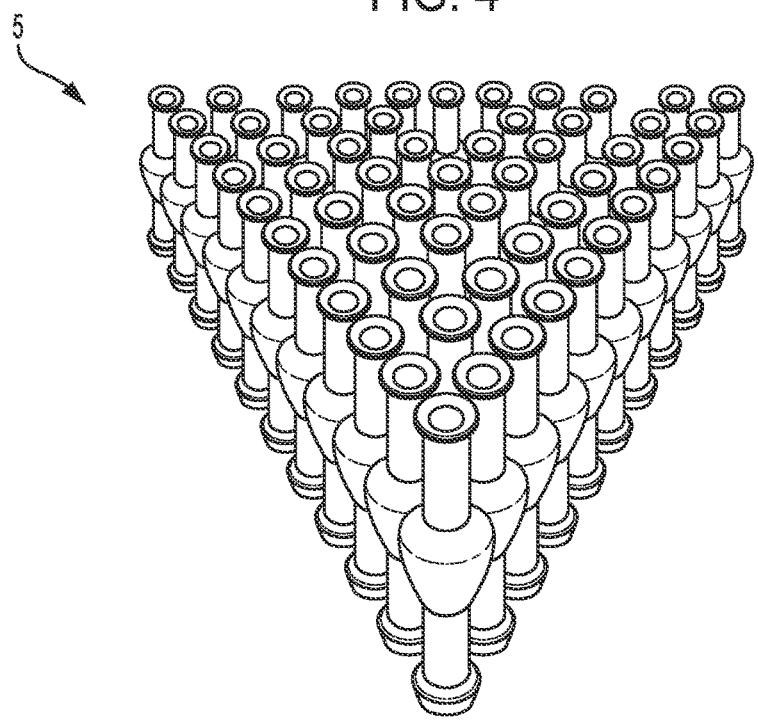
FIG. 5: is a photograph of a plurality of structures to be etched according to various embodiments

To illustrate the variety of structures that can be etched according to various embodiments, FIGS. 3-5 show three images which are samples of possible structures to be etched. FIG. 3 is a photograph of a first exemplary structure 3 to be etched according to various embodiments. More specifically, FIG. 3 is a photograph of a 1.5 GHz 9-cell SRF cavity. FIG. 4 is a photograph of a second exemplary structure 4 to be etched according to various embodiments. More specifically, FIG. 4 is a photograph of a 1.5 GHz single-cell SRF cavity. Comparing FIG. 4 with FIG. 5, to etch 6 GHz SRF cavity, you do not need to move the electrode as its length is small, but it is not the case in case of 9-cell as it is a meter long cavity (approximately). FIG. 5 is a photograph of a plurality of exemplary structures 5 to be etched according to various embodiments.

More specifically, FIG. 5 shows a plurality of 6 GHz cavity. Due to their complex geometries, it can be difficult to etch the inner surface of such cavities. As FIG. 5 is a small structure, approximately 10-12 cm in height and approximately 200-300 square cm area, it might be prudent to etch it without the movement of the inner electrode, but in case of FIG. 3 and FIG. 4 the movement of the inner electrode is beneficial and almost required.

Figure 6:
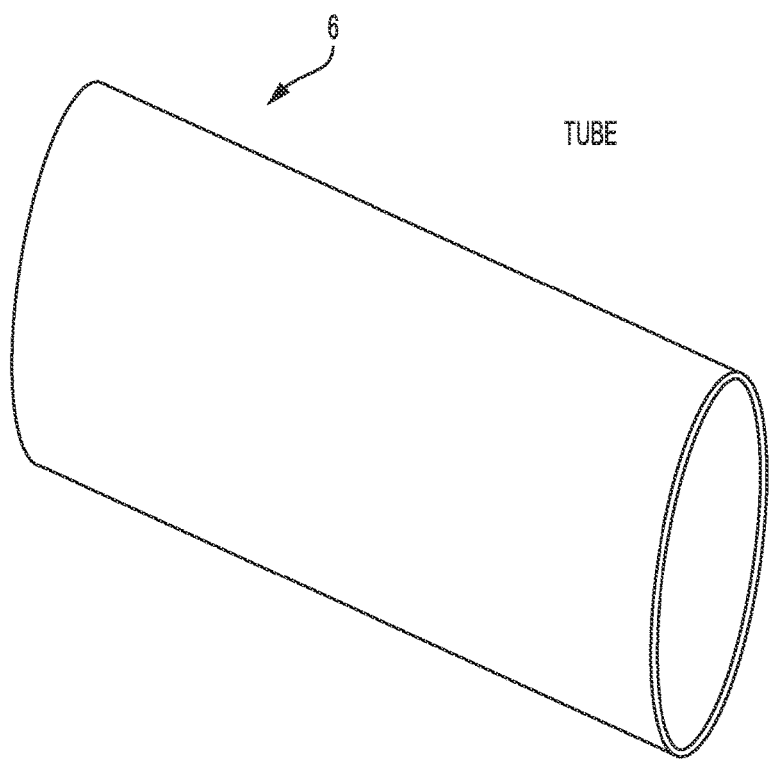
FIG. 6: is a schematic illustration of a tube.
Figure 7:
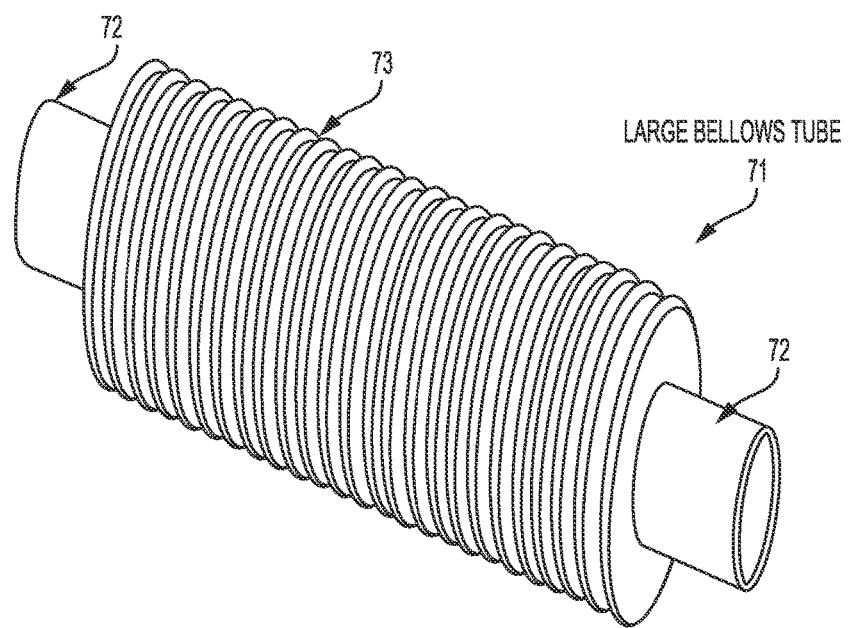
FIG. 7: is a schematic illustration of a large pitch bellows tube; FIG. FIG.
Figure 8:
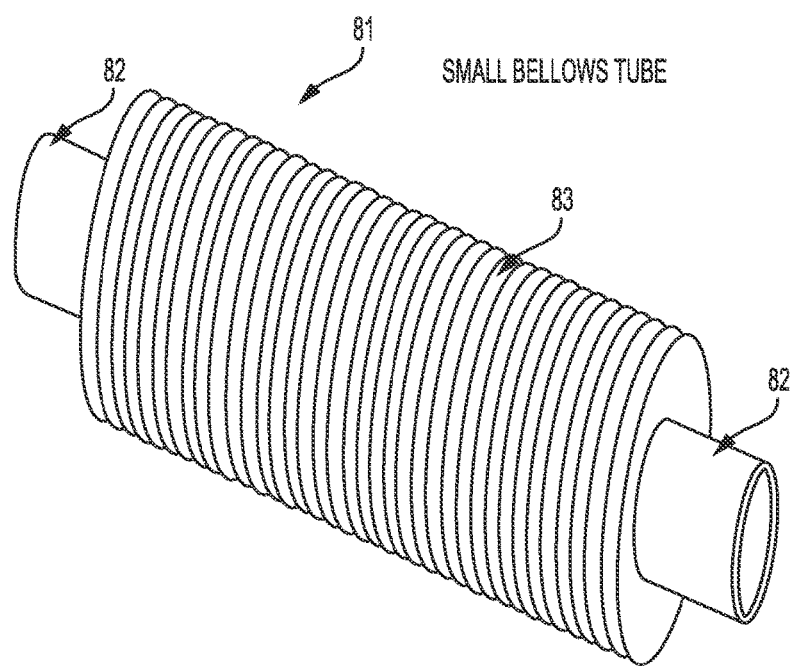
FIG. 8: is a schematic of a small pitch bellows tube.
Figure 9:
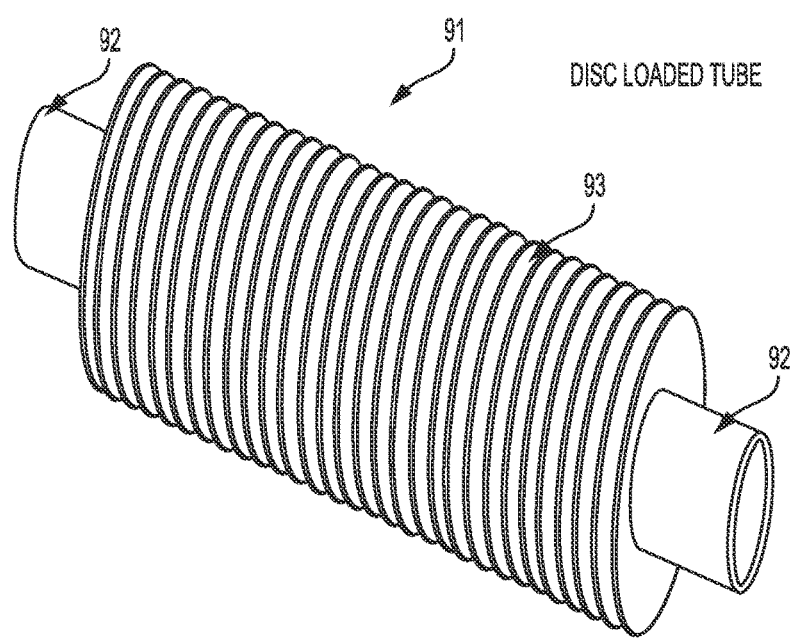
FIG. 9: is a schematic illustration of a disc loaded tube.

According to various embodiments an electrode, including a driven (inner) electrode can be employed. The electrode 6 can have a cylindrical symmetry, as illustrated in FIG. 6. The electrode 6 can be designed and constructed so that it has an equal or larger surface area than the treated outer electrode. FIG. 7 is a schematic illustration of an electrode 71 in the form of a large pitch bellows tube, having cylindrical end segments 72 and a corrugated central section 73. FIG. 8 is a schematic illustration of an electrode 81 in the form of a small pitch bellows tube, having cylindrical end segments 82 and a corrugated central section 83. FIG. 9 is a schematic illustration an electrode 91 in the form of a disc loaded tube, having cylindrical end segments 92 and a corrugated central section 93. Comparing the electrodes 71, 81, and 91 of FIGS. 7, 8, and 9 shows the corrugated section of an electrode according to various embodiments of the invention can have differently sized corrugations. The size and type of corrugations can be selected to provide varying surface areas to the electrode.

FIGS. 7-9 illustrate the shape of various electrodes. For example, if a vessel having a 5 cm inner diameter is to be etched, the inner electrode must have an outer diameter of less than 5 cm. Therefore, if a cylindrical inner electrode is employed, the inner electrode surface area will always be less than the surface area of the outer electrode in the case the inner electrode is a straight tube. This difference in surface areas can create more voltage drop at the inner electrode than at the outer electrode. To reverse voltage drop and to place more surface area on the inner electrode, various embodiments of the present invention utilize a corrugated or wiggling pattern on the surface of the inner electrode. By controlling the distance between two pitches and the depth between two pitches it is possible to optimize the electrode area ratio beneficial to the specific etching process. Generally, the surface area of the inner electrode should be approximately equal to the surface area of the outer electrode, i.e. the inner surface area of the cavity to be etched. In general for the reactive ion etching the surface to be etched should be placed on the smaller area electrode, or should be smaller area electrode. However, according to various embodiments, the surface to be etched is the larger area electrode, or is the outer electrode. Therefore, according to various embodiments, the corrugated-type structures can be employed. In typical RF plasma etching process are limited to planar surfaces, where the surface to be etched is placed on the smaller-area electrode. On the other hand, according to various embodiments of the present invention, the surface to be etched can be the larger area electrode, or the outer electrode. To reduce heat load and sheath voltage drop at the driven electrode various embodiments opt for the corrugated type structure.

Figure 10:
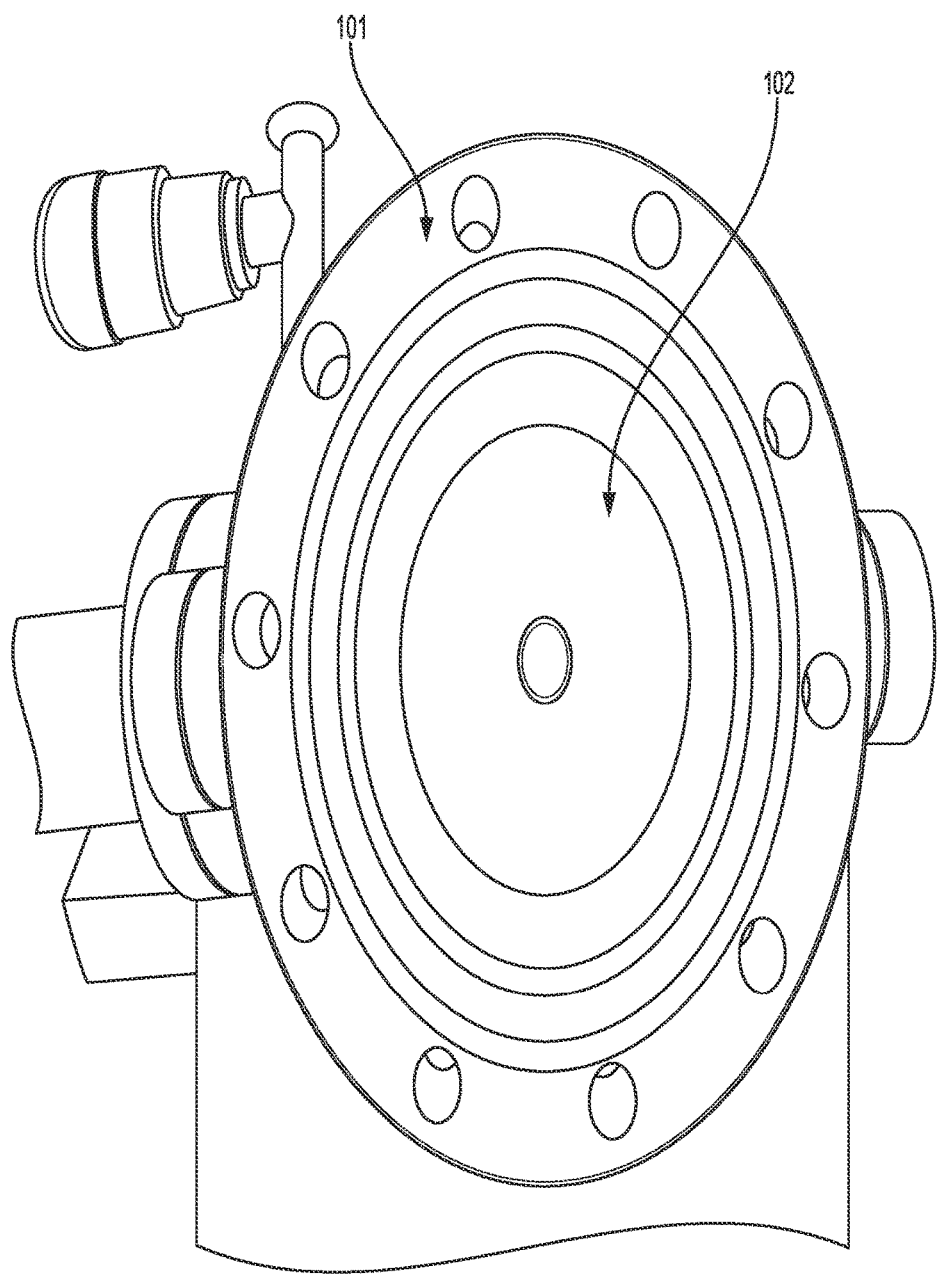
FIG. 10: is a photograph of a driven electrode positioned at the axis of a cylindrical vessel.
Figure 11:
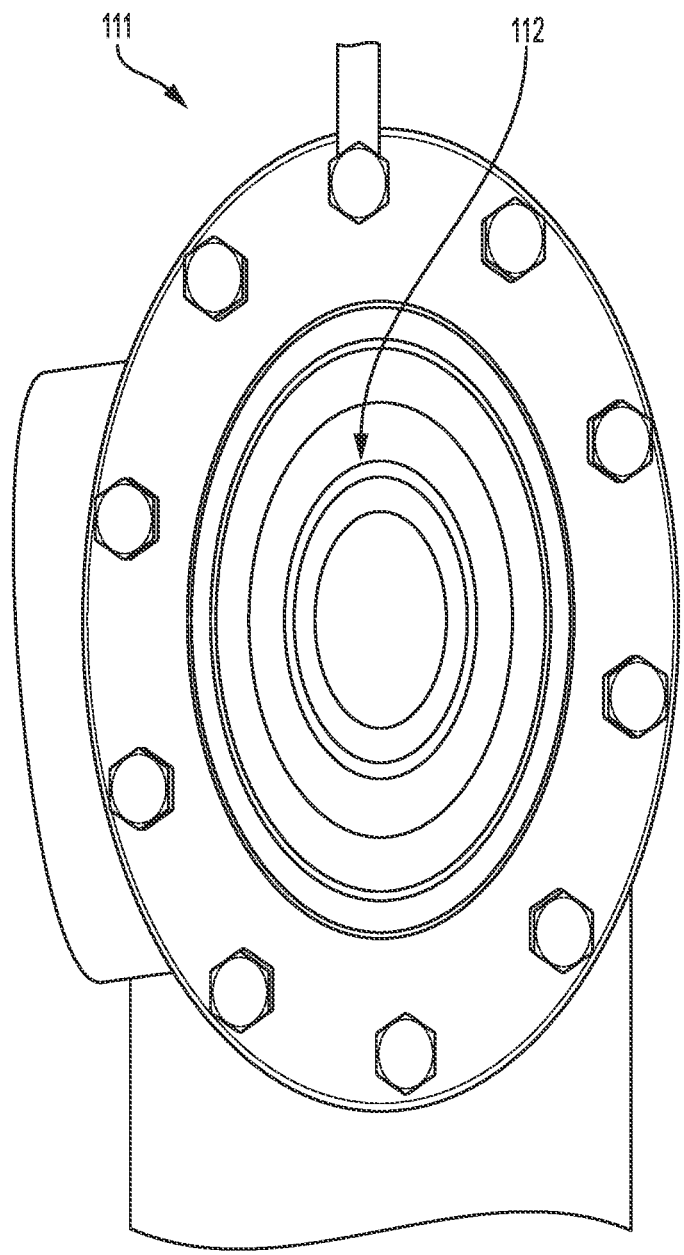
FIG. 11: is a photograph of a driven electrode positioned at the axis of a cylindrical vessel, during an RF discharge.

As illustrated in FIGS. 10 and 11, the driven electrode 102, 112 can be positioned at the axis of the cylindrical vessel 101, 111, containing the hollow cylindrical electrode made of Niobium. The inner electrode material, shape and connection were chosen based on the outer electrode to be etched. The bright light shown in the image is plasma and whitish looking element is the inner electrode.

Etching gases are introduced into the initially evacuated etching chamber in a stepwise manner. The etching gases can include but are not limited to Cl2, SF6, BF3, CF4, CCl2, and combinations thereof with a mixture of Argon, Helium or nitrogen or any inert kind of gas. Any corrosive gas or any corrosive gas in mixture with inert type gas, which makes the volatile product with the surface material to be etched, can be used.

The etching vessel wall, i.e. the outer wall of the cavity to be etched, can be uniformly heated by means of an external tape heater so that the surface temperature of the processed electrode is elevated to a spatially and temporary constant value in the range from 100 to 1500 K. The processing procedure described in U.S. Provisional Application Ser. No. 61/880,415 is initiated.

Dry plasma etching systems and methods according to various embodiments include external heating of the etched cylindrical surface. Measured in the temperature range between room temperature and about 1,500 Kelvin, it has been determined that the layer thickness removal rate, k, approximately obeys the Arrhenius law, $$k = Ae^{-\frac{E_a}{k_B}\frac{1}{T}} \qquad (2)$$

where A is the pre-exponential factor, Ea that we labeled "the activation energy," expressed in form of the energy per molecule in Joules, kB is the Boltzmann constant, and temperature T is expressed in Kelvins.

By way of non-limiting example, the following values for the constants in the simple Arrhenius plot of Eq. (2) can be obtained for a chlorine/argon mixture with given parameters:

$$A \cong 1.65 \times 10^5 \text{ nm/min}$$

$$\frac{E_a}{k_B} \cong 3.58 \times 10^3 \text{ K}$$

Therefore, the common activation energy per molecule is $$E_a \cong (8.62 \times 10^{-5} \text{ eV/K}) \times (3.58 \times 10^3 \text{ K}) \cong 0.309 \text{ eV}$$

Figure 19A:
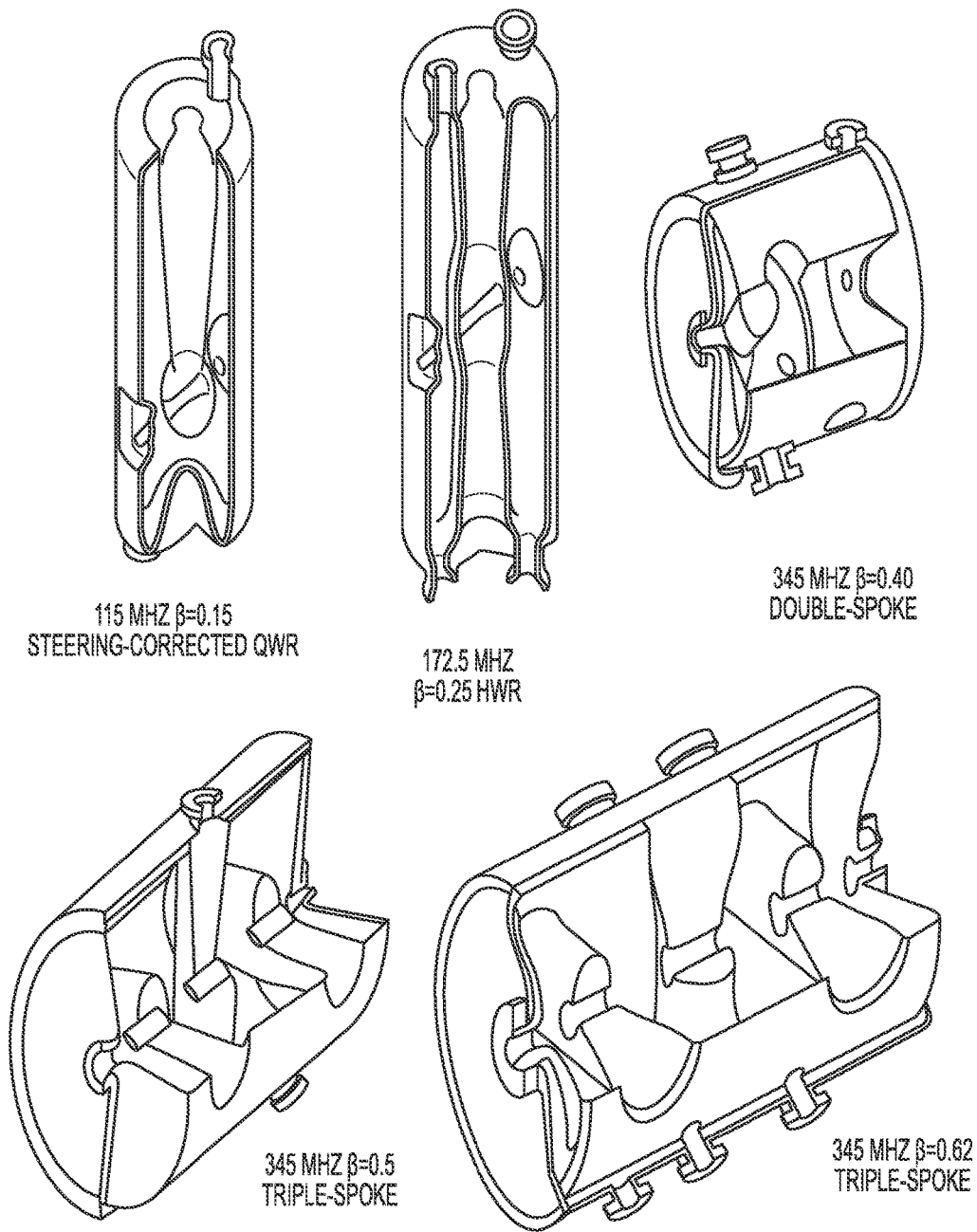
FIGS. 19*a* and 19*b*: are schematic diagrams of a plurality of spoke cavities.
Figure 19B:
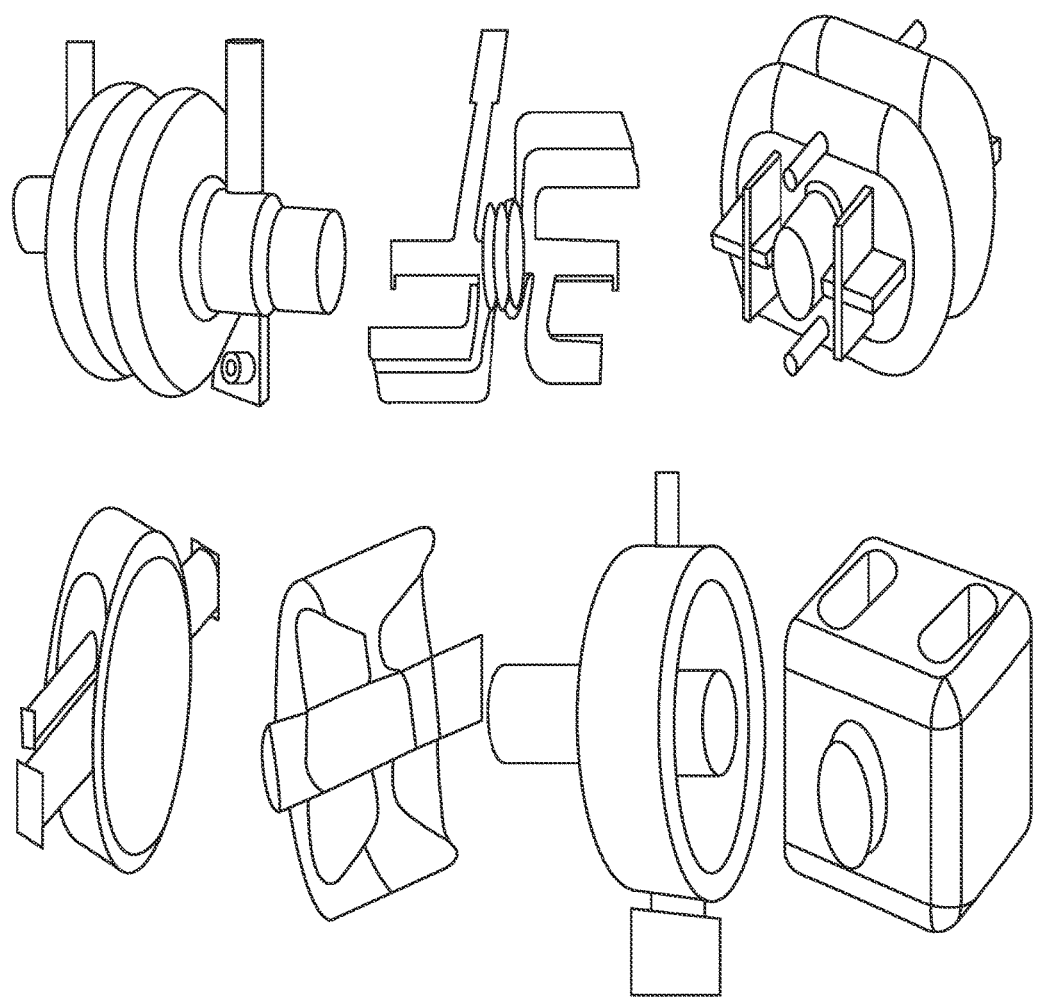

In the case of more complicated structures, there can be a need for two dimensional motion. As used herein, an "X-Y translator" is a system that can move in two directions, if needed. The X-Y translator can move the driven electrode in at least two perpendicular directions. One-dimensional or linear motion can be sufficient for etching the structures illustrated FIG. 3, FIG. 4, and FIG. 5, but in the case of a more complex structure, as illustrated in FIGS. 19a and 19b. Electron bunch dynamics in complex light sources can require cavities with minimum wakefield instabilities. FIG. 19a illustrates a plurality of spoke cavities for acceleration. FIG. 19b illustrates a plurality of crab cavities for deflection. In order to etch the interior of more complex cavities as illustrated in FIGS. 19a and 19b, it can be necessary to move the driven electrode in the multiple directions to etch the surface uniformly.

Figure 12A:
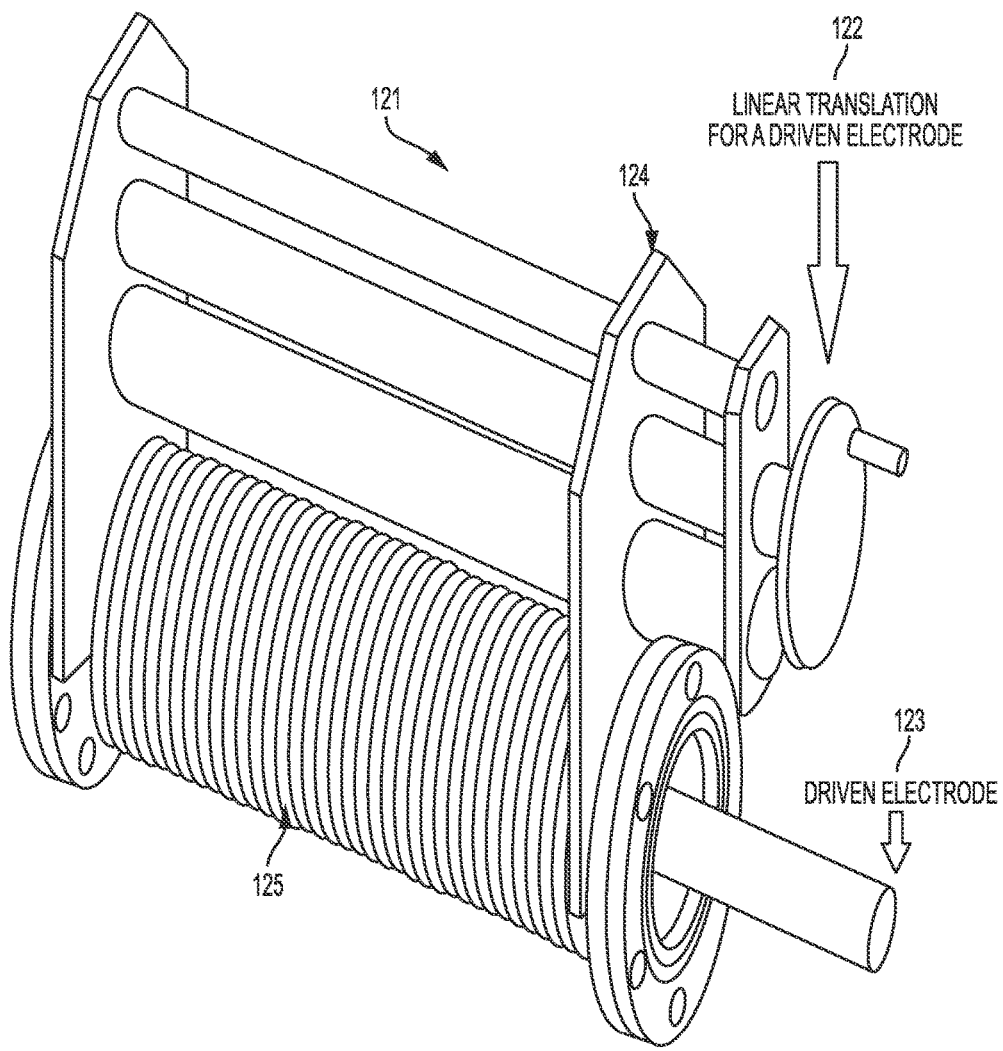
FIGS. 12*a* and 12*b*: are schematic illustrations of a device for moving the inner (driven) electrode inside the structure which is supposed to be etched.
Figure 12B:
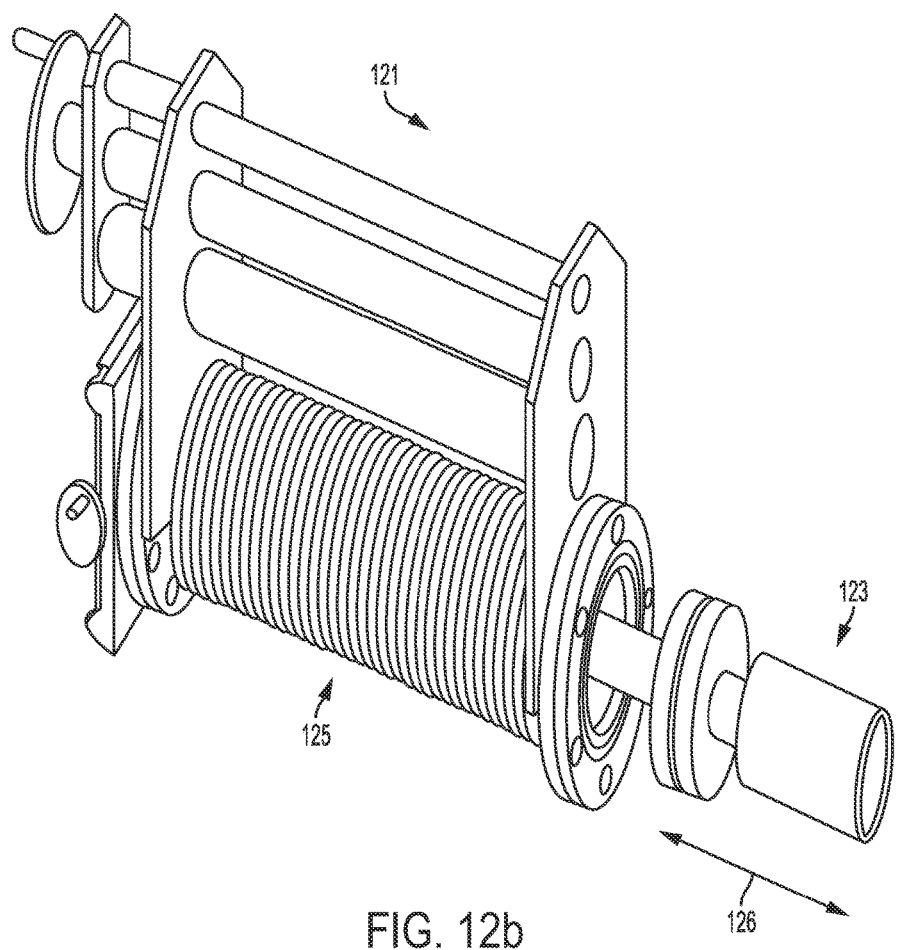

FIGS. 12a-b are schematic illustrations of a driven electrode assembly 121 comprising a driven electrode 123. The driven electrode 123 is attached to an x-y translator 122. The translator 122 can move the driven electrode 123 in a stepwise manner and the processing can be performed segment by segment. The translator 122 motion can be controlled by a stepper motor with controllable speed and resolution. The driven electrode 123 can be moved back and forth in an axial direction 126. The electrode motion can be performed during plasma operation. Plasma configuration is not affected by the motion, which has been verified experimentally. The inner electrode can be moved during the plasma operation, which did not switch off or show any fluctuation. Therefore, the driven electrode can be moved toward the area to be etched without disturbing the plasma conditions.

Figure 12C:
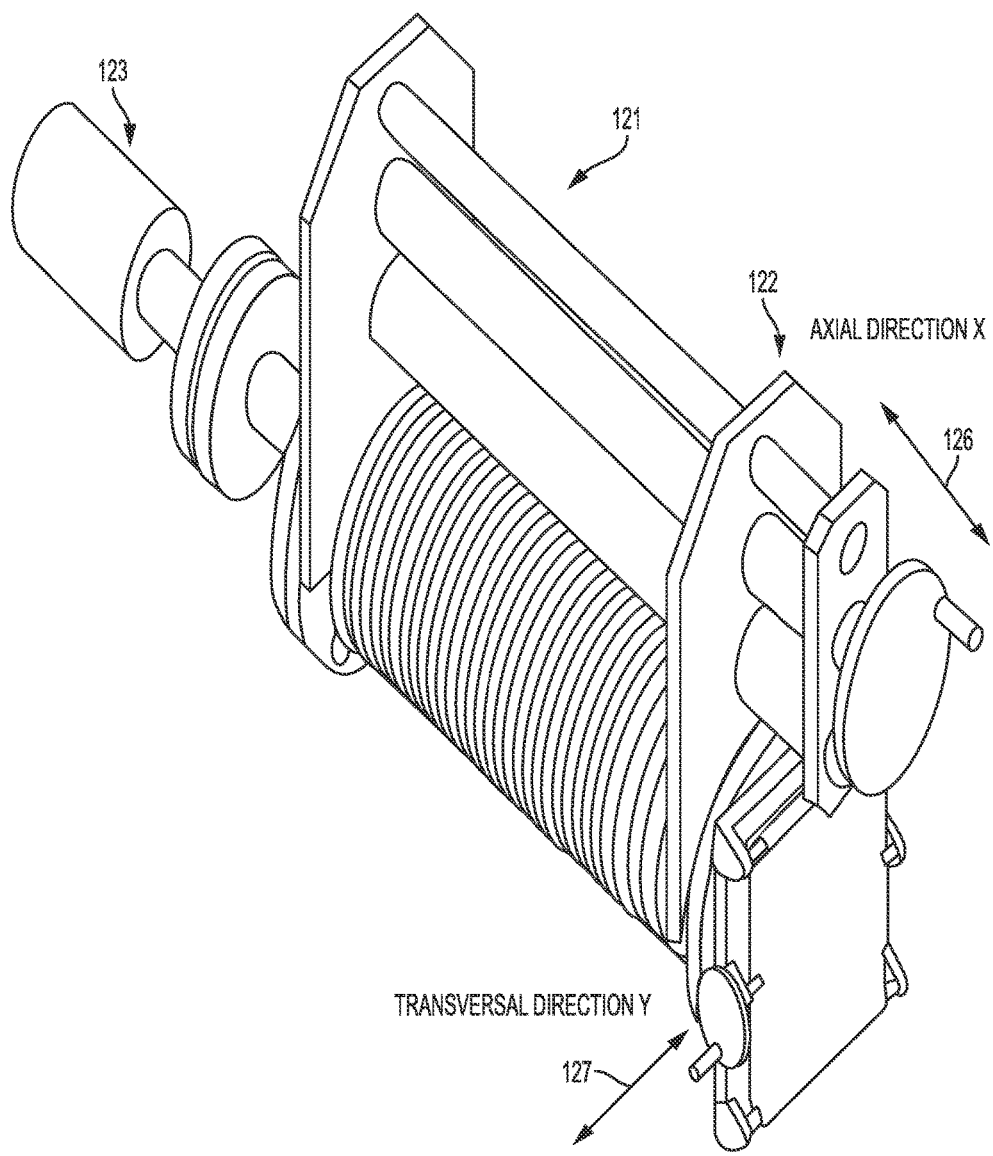
FIG. 12*c*: is a schematic illustration of a device for moving the inner (driven) electrode inside the structure which is supposed to be etched.

FIG. 12 is a schematic illustration of a driven electrode assembly 121 having an x-y translator 122, showing both axial direction 126 and a transverse direction 127 in which the driven electrode can be moved.

The driven electrode assembly 121 can be used to move the inner (driven) electrode 123 inside the structure which is supposed to be etched. The driven electrode assembly 121 works by using the translator 122 to force plate 124 to squeeze and releasing the bellows 124, which house the driven electrode 123. When the bellows 124 are compressed the driven electrode 123 translates in and out of the driven electrode assembly 121. Only a small portion of the electrode 123, which is shown in the figure, is active as the rest is under atmospheric pressure and shielded. The moving electrode 123 contributes to etching in uniform way a long structure.

Figure 13:
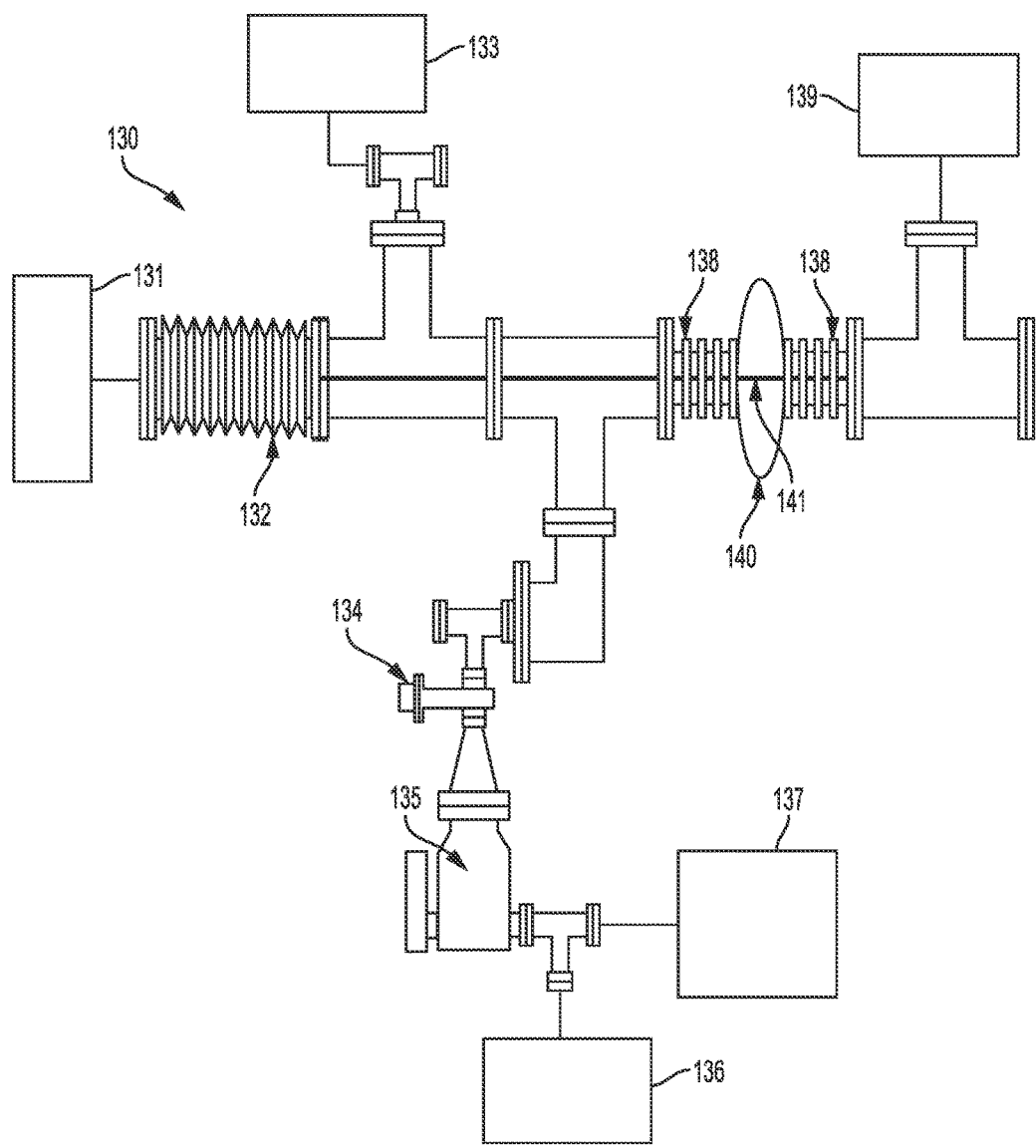
FIG. 13: is a schematic illustration of block diagram of an RF plasma system according to various embodiments.

FIG. 13 is a schematic block diagram of an RF plasma etching system 130. As shown the system 130 can include a gas flow system 139 supplying gas to the cavity 140, such as a Niobium cavity. The cavity 140 can be encircled by heating tape 138. A driven electrode 141 can be disposed within the cavity 140. Power can be supplied to the driven electrode 141 via a power supply system 131. The driven electrode 141 can be moved via a bellow 132. A pressure gauge 133 can be provided to monitor the pressure in the system 130. Gas provided by the gas flow system 139 can be removed from the system via a vacuum system 137, which can be monitored and controlled by a second pressure gauge 136, a turbomolecular pump 135 and a valve 134. To illustrate the segment wise etching of the cavity, the electrode has been depicted broken inside the cavity. The electrode can travel in stepwise fashion inside the cavity to etch it segment by segment.

Figure 14A:
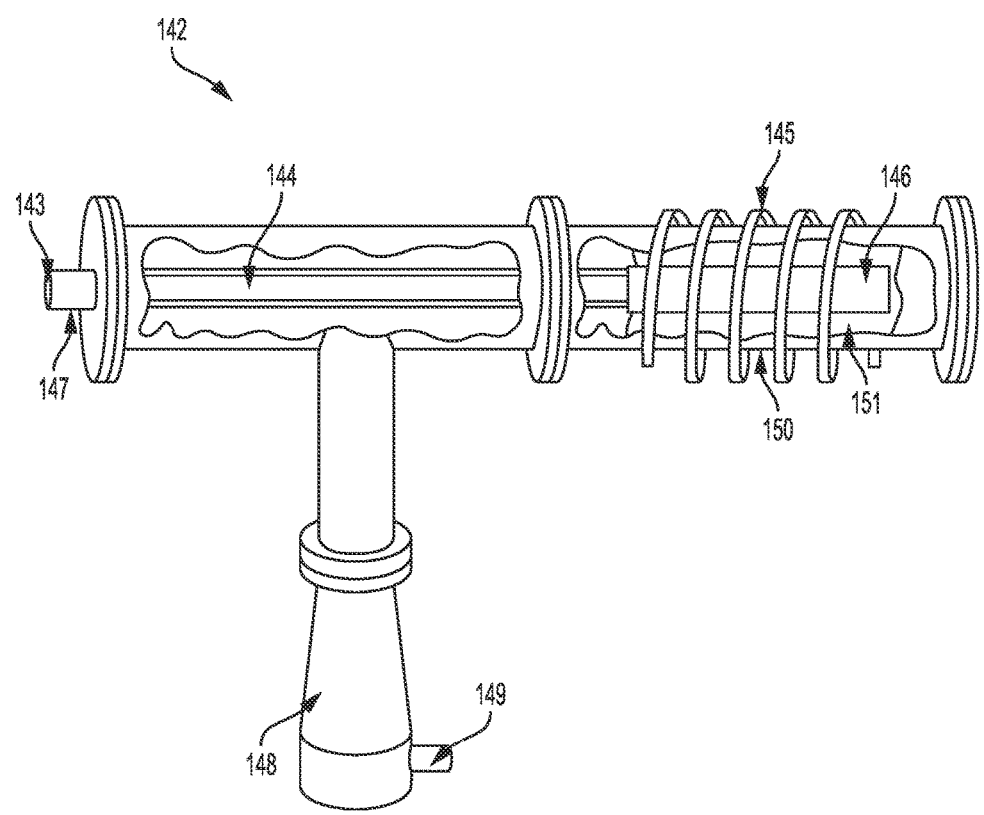

FIGS. 14a-b are schematic illustrations of an RF plasma etching system 142 according to various embodiments. FIGS. 14a-b illustrate the heating method applied. More specifically, heating tape 145 is wrapped around the cavity or structure 150 to be internally etched. The heating tape 145 can heat the surface of the structure 150 to be etched. The heating tape 145 can be used to maintain the temperature of the structure 150 to be etched. A driven electrode 146 can be disposed within the structure 150. The driven electrode 145 can have any structure as described in other embodiments, including but not limited to a tube-shape, a corrugated-shape, or a wiggling shape. A plasma region 151 can be created within the structure 150. Power can be supplied to the driven electrode 145 via an RF power coupling 143. The power supply can be RF or MW or DC (pulsed) power supply 147. The driven electrode can be held under atmospheric pressure and shielded as indicated by dotted line 144. Until dotted line 144 connects driven electrode 146 within structure 150, all electrical connections are under atmospheric pressure, so there is no plasma production. The plasma region 151 only occurs in the shade region as illustrated. Gas can be evacuated from the system 142 via a turbomolecular pump 148, backed by a roughing pump 149. The cavity temperature of the structure 150 can be varied using the external heating tape 145. The tape 145 can be wrapped around the external cavity wall and set at the required wall etching temperature. The power coupling area is not heated. In FIG. 14b, an x-y translator 1401 is shown that comprises bellows 1402 and a connection 1403 to an electrical supply (not shown).

Figure 18:
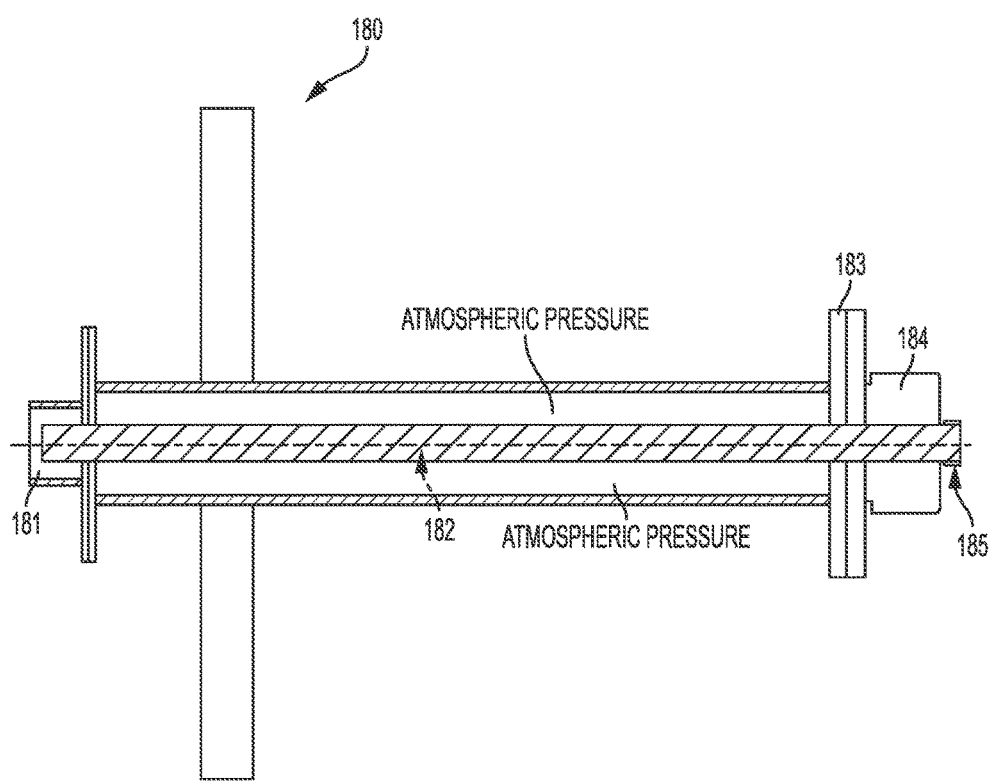
FIG. 18: is a schematic diagram of an RF coupling vacuum feed through according to various embodiments.

Referring to FIG. 18, an RF coupling vacuum feedthrough 180 is shown. RF coupling vacuum feedthrough 180 contains an HN type connector with its holder 181, 200 to 300 mm long coaxial connector with the inner conductor 182 ending with a thread 185 to be attached to the inner electrode 182, and the outer conductor equipped with two conflate flanges, one of which being a miniconflat flange 183 with electric feedthrough. The cylindrical gap surrounding the conductor 182 is filled with air at atmospheric pressure and sealed off. Connector ending 184 can be covered with a ceramic insulator up to the connecting thread 185. For purposes of the present application, HN connectors are medium-sized weatherproof units designed for high voltage applications.

Figure 15A:
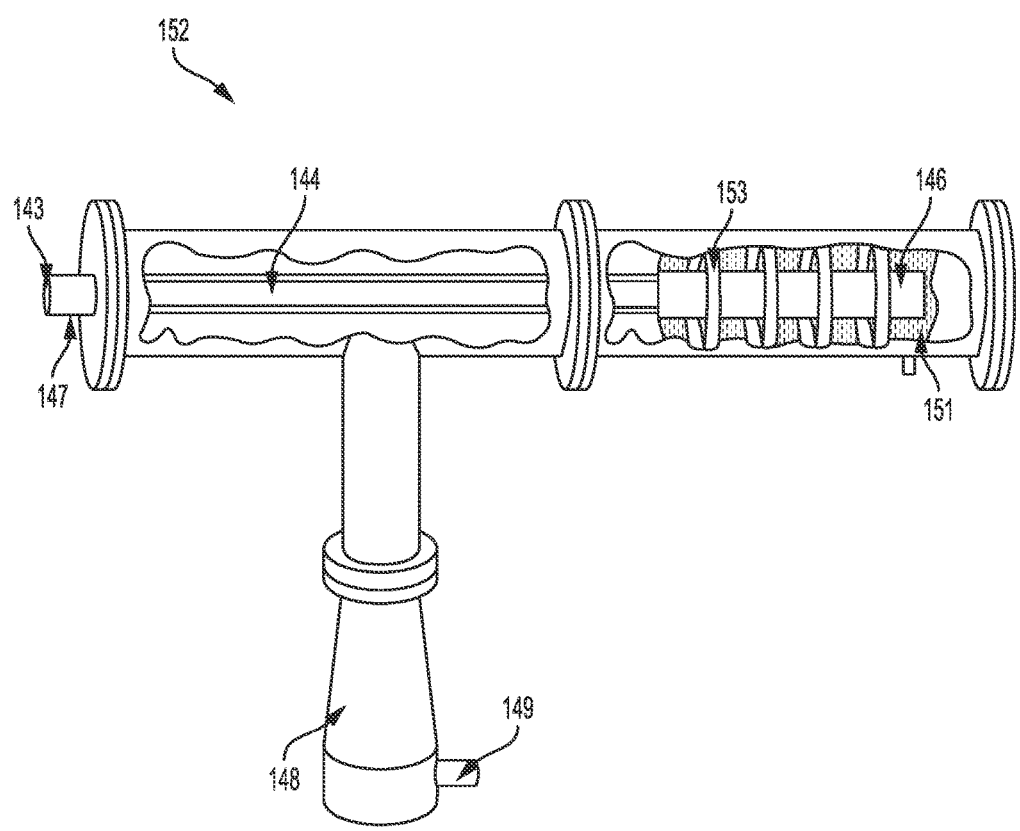
FIGS. 15*a* and 15*b*: are schematic illustrations of ring samples placed inside the cavity of an RF plasma system according to various embodiments.
Figure 15B:
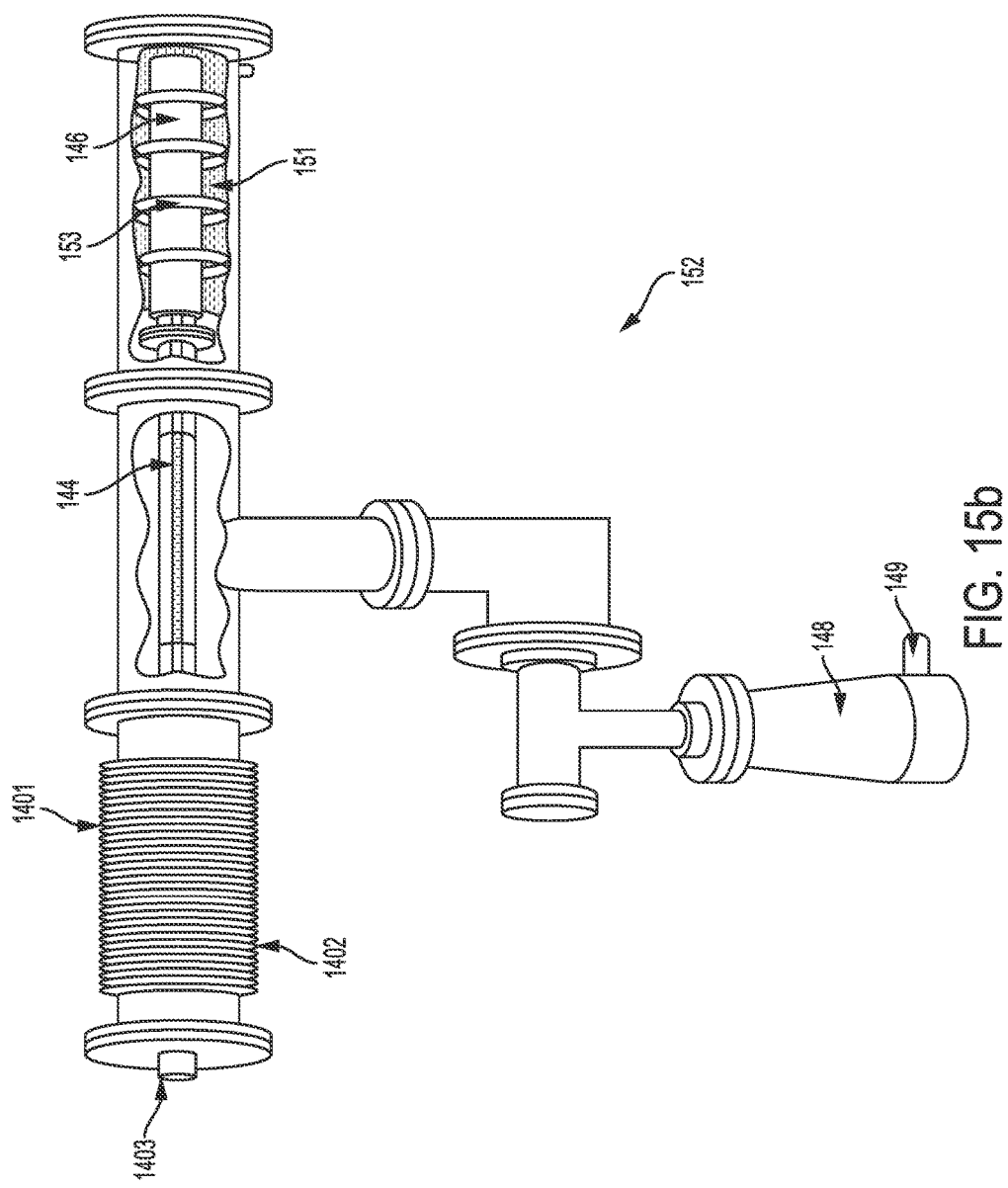

FIGS. 15a-b are schematic illustrations of an RF plasma etching system 152 according to various embodiments. All structural elements of the RF plasma etching system 152 are the same as in FIGS. 14a-b, with like reference numerals indicating the same structures. The distinction between FIGS. 15a-b and FIGS. 14a-b is the presence of ring samples 153 disposed within the plasma region 151. The driven electrode 146 is disposed within the ring samples 153. The ring samples 153 are placed inside the cavity for etching diagnostic purposes, to measure etch rate and surface properties of the etched sample. Therefore, the ring samples 153 are used for experimental purpose, for optimization of parameters like pressure, power, gas concentrations, temperature, bias etc. Flat and ring samples are not used during the etching of a cylindrical or any three-dimensional structure.

Figure 16:
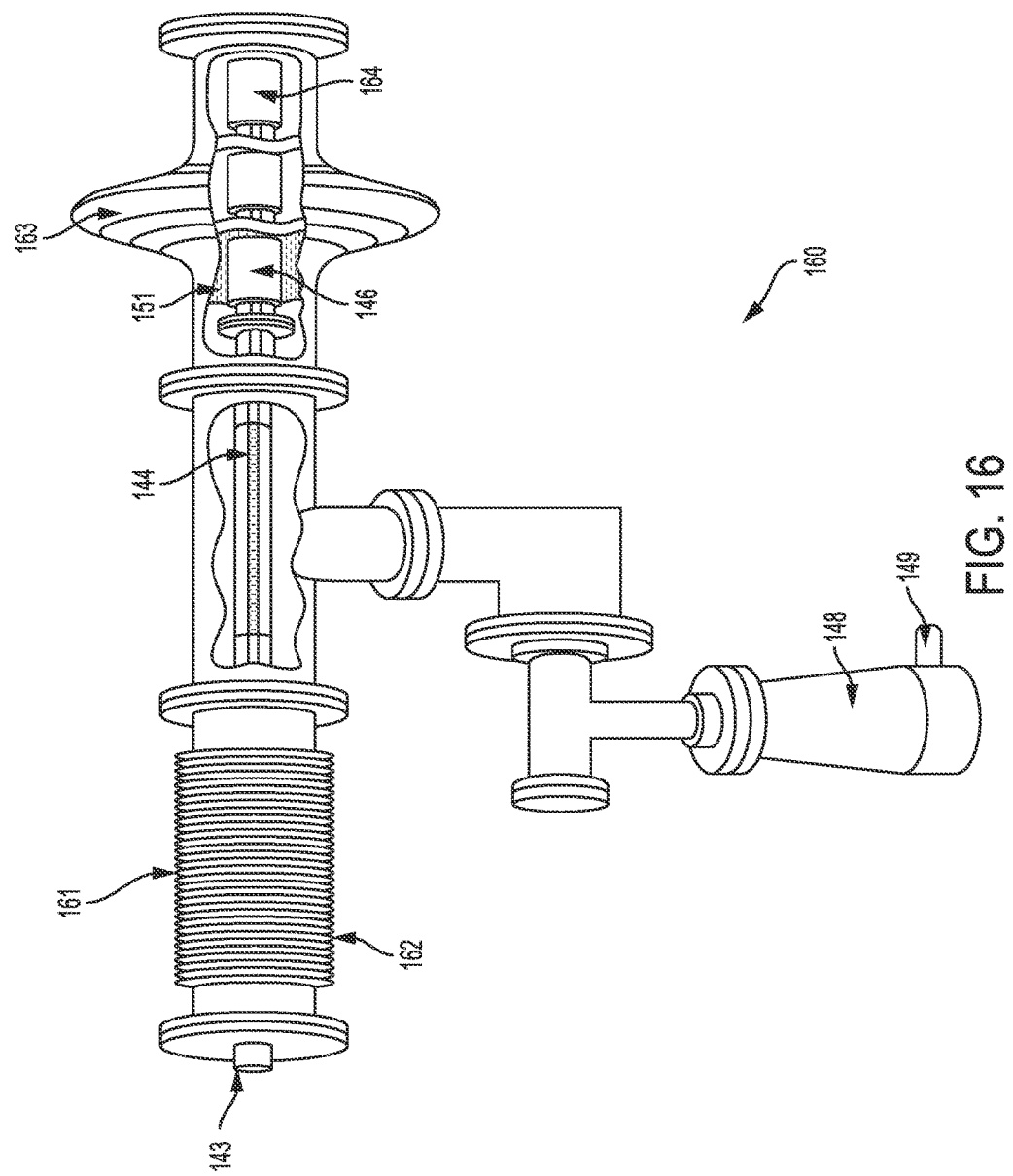
FIG. 16: is a schematic illustration showing a driven electrode movement in the three dimensional etching.

FIG. 16 is a schematic illustration of an RF plasma etching system 160 according to various embodiments. The system 160 includes a connection 143 to supply power to a driven electrode 146. The driven electrode 146 is under atmospheric pressure and shielded in section 144 of the system 160. The driven electrode 146 can include one or more corrugated segments 164. Depending on the squeezing and releasing of the bellows 161 in the translation segment 162 of the system 160, the driven electrode 146, a plasma region 151 can be created in whichever region of a cavity of a structure 163 that is exposed to the driven electrode. The structure 163 can be a single cell or multi-cell complex structure. As in other embodiments, a turbomolecular pump 148 backed by a roughing pump 149 can be provided to evacuate gas from the system 160. The dotted lines of the corrugated segments 164 of the driven electrode 146 are presented to show the linear motion of the driven electrode 146 through the cavity of the structure 163 to be etched. Therefore, FIG. 16 shows the driven electrode 146 moving in an exemplary three dimensional etching application. Because of loading effect and plasma properties variation, it can be difficult to uniformly etch a given structure by etching the whole structure at once. To overcome this problem, various embodiments can employ a translation stage equipped with bellows, such as bellows 161 to move the driven electrode 146 inside the structure 163 and perform segment-wise etching. Such embodiments allow for the etching of one sub section of the structure 163 at a time, by placing the driven electrode 146 at the corresponding axial position. When etching of the first segment is completed the driven electrode 146 can be translated to the next subsection by squeezing and releasing the bellows 161, which is holding the manifold of the driven electrode 146.

Figure 17A:
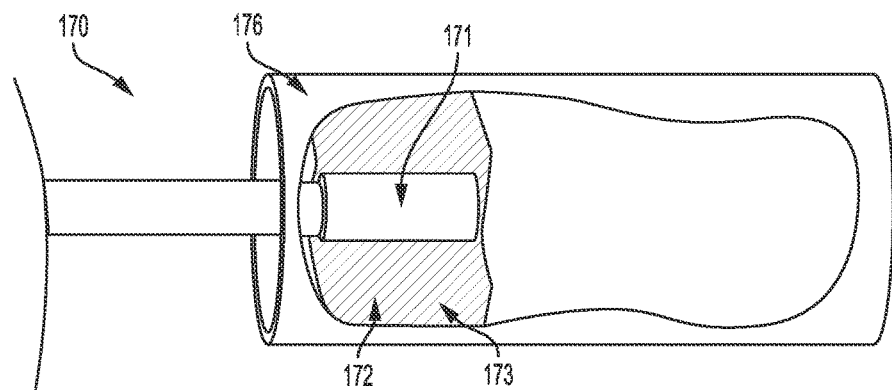
FIGS. 17*a* and 17*b*: are schematic illustrations showing coaxial plasma segments according to various embodiment.
Figure 17B:
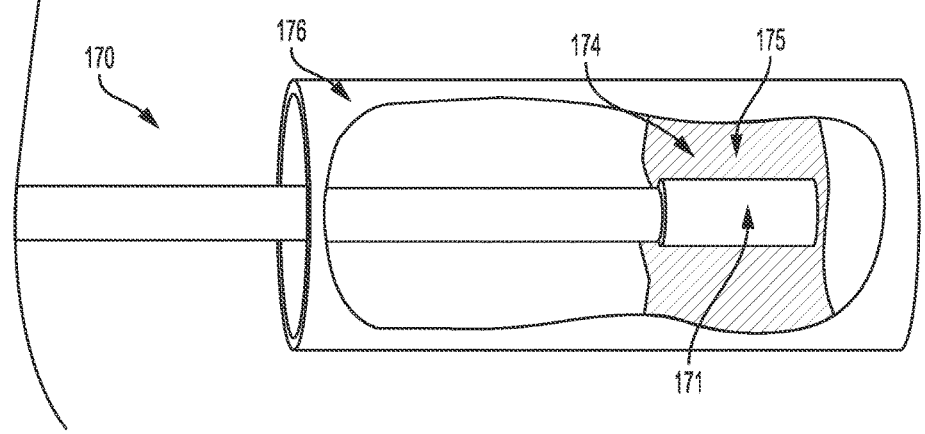

FIGS. 17a and 17b are schematic illustrations of a coaxial plasma segment 170. The segment 170 includes a structure 176 to be etched. A driven electrode 171 can be disposed within the structure 176 from a first position 172 to a second position 174. At each position 172, 174, the driven electrode 171 can be used to generate a plasma region 173, 175. The plasma regions 173, 175 can be coaxial plasma regions and can depend on where the electrode is positioned within the structure 176. The driven electrode 171 can have any structure as described in other embodiments, including but not limited to a tube-shape, a corrugated-shape, or a wiggling shape. FIGS. 17a and 17b show that the plasma 173, 175 exists at the volume corresponding to the location 172, 174 where the driven electrode 171 is moved. Referring the shaded portions as plasma, the figures illustrate the synchronized motion of the driven electrode 171 and the plasma.

Figure 20B:
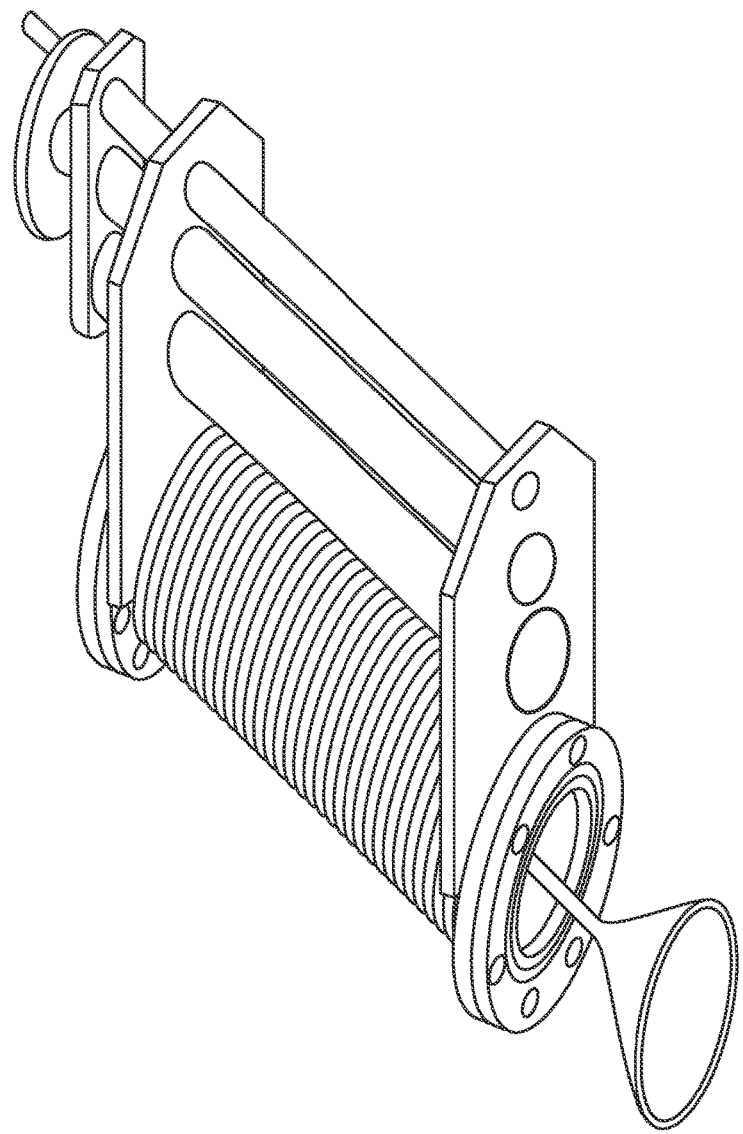
FIG. 20*b*: is a schematic illustration showing incorporation of the gas diffuser into the inner electrode.

FIG. 20a is the schematic illustration of coaxial conical gas diffuser that serves as the conduit for gas mixture intake. FIG. 20b indicates that the gas diffuser is incorporated into the inner electrode.

Although the present invention has been described in considerable detail with reference to certain preferred versions thereof, other versions are possible. Therefore, the spirit and scope of the appended claims should not be limited to the description of the preferred versions contained herein.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C §112, sixth paragraph. In particular, the use of "step of" in the claims herein is not intended to invoke the provisions of 35 U.S.C §112, sixth paragraph.

What is claimed:

1. A method for efficient plasma etching the inner wall of a chamber cavity, wherein the inner wall comprises one selected from the group consisting of a metal, a semiconductor, a dielectric material, and combinations thereof, the method comprising:
　　positioning an inner electrode within the chamber cavity;
　　evacuating the chamber cavity;
　　wherein the chamber cavity has an internal surface area of from 50 to 10000 cm2;
　　adding 60 to 100 weight percent of a first inert gas selected from the group consisting of Argon (Ar), Krypton (Kr), Helium (He), Xenon (Xe), and Nitrogen (N2), and combinations thereof to the chamber cavity at a pressure of from 0.01 to 1 Torr;
　　regulating the pressure in the chamber;
　　generating a plasma sheath along the inner wall of the chamber cavity by applying one selected from the group consisting of:
　　　　a radiofrequency (RF) discharge at a frequency of from 1 to 150 MHz,
　　　　a microwave discharge at power density of 0.1 to 3 W/cm3 and frequency of 1.3 to 3 GHz,
　　　　a pulsed d.c. high voltage (HV) discharge at average power density of 0.1 to 3 W/cm3, and
　　　　combinations thereof;

adjusting a positive D.C. bias on the inner electrode to establish the effective plasma sheath voltage of from 10 to 500 V;

adding 1 to 15 weight percent of a first electronegative gas selected from the group consisting of Cl2, 02, BF3, CCl4, and SF5, and combinations thereof to the chamber cavity at a pressure of from 0.01 to 1 Torr;

optionally readjusting the positive D.C. bias on the inner electrode reestablish the effective plasma sheath voltage at the chamber cavity of 10 to 500 V;

etching the inner wall of the chamber cavity at a rate of from 10 to 1500 nm/min;

polishing the inner wall to an RMS surface roughness of 80 to 500 nm by one selected from the group consisting of mechanical polishing, electro-polishing, and combinations thereof.

2. The method of claim 1, wherein regulating the pressure in the chamber comprises adjusting a flow rate of one or more components of the gaseous mixture into the chamber cavity, and adjusting a pressure relief valve.

3. The method of claim 1, wherein the chamber cavity has a structure selected from the group consisting of a closed cylindrical structure, an elliptical structure, a hyperbolical structure, a spherical structure, a conical structure, and combinations thereof.

4. The method of claim 1, wherein regulating the pressure in the chamber comprises adjusting a pressure relief valve in a pumping manifold that is fluidically coupled to the chamber cavity.

5. The method according to claim 1, wherein the chamber cavity is a Superconductive Radio Frequency (SRF) Cavity.

6. The method according to claim 1, further comprising adding from 0 to 20 weight percent of a second inert gas selected from the group consisting of Argon (Ar), Krypton (Kr), or Helium (He), Xenon (Xe), and Nitrogen (N2), and combinations thereof to the chamber cavity.

7. The method according to claim 1, further comprising adding from 0 to 5 weight percent of a second electronegative gas selected from the group consisting of Cl2, 02, BF3, CCl4, and SF6, and combinations thereof to the chamber cavity.

8. The method according to claim 1, wherein the inner electrode is positioned in a cylindrical coaxial configuration within the chamber cavity, thereby forming an annular space between the inner electrode and the inner wall of the chamber cavity.

9. The method according to claim 1, further comprising adjusting a flow rate of all gases added to the chamber cavity to achieve a residence time of ions and other plasma radicals within the chamber cavity of from 1 to 1000 ms.

10. The method according to claim 1, wherein the metal is selected from the group consisting of Niobium, Aluminum, Copper, and combinations thereof.

11. The method according to claim 1, wherein the semiconductor is silicon.

12. The method according to claim 1, wherein the dielectric material is alumina.

13. The method according to claim 1, wherein the inner wall comprises a metal, and wherein the metal is a transition metal.

14. The method according to claim 13, wherein the transition metal is selected from scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, and combinations thereof.

15. The method according to claim 14, wherein the transition metal is selected from niobium, copper, and combinations thereof.

16. The method according to claim 1, wherein an outer wall of the chamber cavity is covered with a heating tape to keep the cavity at a specified temperature.

17. The method according to claim 1, wherein the specified temperature is from 100 to 1500 degrees Kelvin.

18. The method according to claim 1, wherein the chamber cavity has cylindrical symmetry.

19. The method according to claim 1, wherein the inner electrode is a driven electrode.

20. The method according to claim 19, wherein the driven electrode is corrugated.

21. The method according to claim 19, wherein the driven electrode is positioned inside a compressible bellows tube, which is adapted to translate the driven electrode within the chamber cavity.

22. The method according to claim 21, wherein the bellows tube is compressed by an x-y translation stage, and wherein compression of the bellows tube enforces the motion of the driven electrode in axial direction within the chamber cavity for sequential etching.

23. The method according to claim 22, wherein the translation stage is adapted to move the driven electrode in a transversal direction, wherein the transversal direction is perpendicular to the axial direction.

* * * * *